United States Patent
Koelle et al.

(10) Patent No.: US 6,373,705 B1
(45) Date of Patent: Apr. 16, 2002

(54) ELECTRONIC SEMICONDUCTOR MODULE

(75) Inventors: Gerhard Koelle, Wiernsheim; Wolfgang Jacob, Horb; Harald Tschentscher, Grossbottwar; Stephan Rees, Ludwigsburg, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,971

(22) PCT Filed: Dec. 23, 1999

(86) PCT No.: PCT/DE99/04085

§ 371 Date: Feb. 13, 2001

§ 102(e) Date: Feb. 13, 2001

(87) PCT Pub. No.: WO00/42654

PCT Pub. Date: Jul. 20, 2000

(30) Foreign Application Priority Data

Jan. 11, 1999 (DE) ......................................... 199 00 603

(51) Int. Cl.$^7$ ................................................ H05K 7/20
(52) U.S. Cl. ........................ 361/720; 361/699; 361/704; 361/715; 361/719; 361/760; 361/763; 257/706; 257/714; 174/15.1; 174/16.1; 174/16.3; 165/80.2; 165/80.4; 165/104.33
(58) Field of Search ................................ 361/689, 690, 361/698, 699–704, 707, 718, 719, 720, 715, 717, 722, 760, 761, 763, 783, 784; 257/675, 706, 712–715; 174/15.1, 15.2, 16.3; 165/80.2–80.4, 104.33, 185

(56) References Cited

U.S. PATENT DOCUMENTS

| | | |
|---|---|---|
| 4,777,060 A | 10/1988 | Reinhard et al. |
| 5,398,160 A * | 3/1995 | Umeda ........................ 361/707 |
| 5,436,793 A * | 7/1995 | Sanwo et al. ................ 361/689 |
| 5,504,378 A * | 4/1996 | Lindberg et al. ........... 307/10.1 |
| 5,763,951 A * | 6/1998 | Hamilton et al. ........... 257/714 |
| 6,060,772 A * | 5/2000 | Sugawara et al. .......... 257/678 |
| 6,295,201 B1 * | 9/2001 | Ogden et al. ................ 361/704 |

FOREIGN PATENT DOCUMENTS

| | | |
|---|---|---|
| EP | 0 018 174 | 10/1980 |
| EP | 0 508 717 | 10/1992 |

OTHER PUBLICATIONS

*Research Disclosure, GB, Industrial Opportunities Ltd. Havant, "Use of a Composite Metal Pad for Wire Bond Connection to the Coppercore of a Metal Core Substrate Circuit Board", Sep. 1, 1989, p. 683.
** H. de Lambilly, H. Kesser "Failure Analysis of Power Modules: A Look at the Packaging and Reliability of Large IGBTs", (1992), pp. 366–370, IEEE/CHMT Int. Electronics Manufacturing Technology Symposium.

* cited by examiner

*Primary Examiner*—Leo P. Picard
*Assistant Examiner*—Boris L. Chervinsky
(74) *Attorney, Agent, or Firm*—Kenyon & Kenyon

(57) ABSTRACT

In order to improve heat dissipation and to reduce parasitic inductivity in an electronic semiconductor module, which has a carrier substrate having an electrically insulating layer, a metal layer in which printed conductors are formed via structuring and which is arranged on the upper side of the insulating layer, and a metal cooling body arranged on the lower side of the insulating layer, and at least one semiconductor component arranged on the carrier substrate, the electrically insulating layer has at least one notch, and at least one terminal face provided on the upper side of the semiconductor component facing away from the carrier substrate is electrically connected to a contact element which is directly connected to the metal cooling body via the notch.

8 Claims, 3 Drawing Sheets

ELECTRONIC SEMICONDUCTOR MODULE

FIELD OF THE INVENTION

The present invention relates to an electronic semiconductor module.

BACKGROUND INFORMATION

Semiconductor modules of this kind have an insulated metal substrate (IMS) as the carrier substrate; this includes a metal plate which functions as a cooling body and has an electrically insulating layer on its upper side and a thin metal layer arranged on the insulating layer. The insulating layer conducts heat effectively and includes, for example, a thin polymer layer into which ceramic powder is introduced to improve its ability to dissipate heat. Printed conductors are formed on the upper side of the substrate by structuring the metal layer. Electronic semiconductor components are provided on the upper side and electrically connected to the printed conductors via bonding wires. The advantage of using an insulated metal substrate is, in particular, that the heat generated by the semiconductor component can be dissipated effectively into the metal cooling body via the relatively thin insulating layer, which conducts heat effectively.

Aside from insulated metal substrates, the use of direct copper bonded (DCB) substrates in electronic semiconductor modules is known, for example from: H. de Lambilly, H. Keser: *Failure Analysis of Power Modules: A Look at the Packaging and Reliability of Large IGBTs*, IEEE/CHMT Int. Electronics Manufacturing Technology Symposium 1992, page 366. The direct copper bonded substrates include a relatively thick ceramic carrier, with its upper and lower side being provided with a thin metal layer via a special compression process. Printed conductors are provided on the upper metal layer via structuring. On the upper side of the module, semiconductor components are connected to the printed conductors via bonding wires. A thick metal plate which functions as a heat sink is soldered onto the lower metal layer of the carrier substrate. Furthermore, it is known from European Published Patent Application No. 0 508 717 that cooling channels through which a cooling medium flows can be provided in the metal plate. A particular disadvantage of the direct copper bonded substrates compared with the insulated metal substrates is that the ceramic layer is thick, which makes it more difficult for heat to be transmitted to the cooling body.

The known semiconductor modules described above have the following disadvantage that all the terminal connectors of the semiconductor components are arranged on the upper side of the carrier substrate. Because the printed conductors paths are all in this one position, they are very complicated. In electronic circuits with a high level of integration, the substrate, which is in any case expensive, must be enlarged laterally to house all the necessary printed conductor wiring on the upper side of the carrier substrate. This considerably increases manufacturing costs. It is particularly disadvantageous that because all the terminal connectors are arranged in the upper metal layer of the substrate, significant parasitic inductivity arises and can cause substantial overvoltages. This has a particularly disadvantageous impact if power electronic circuits having direct voltage circuits are arranged on the carrier substrate. The parasitic inductivity causes undesirable overvoltages which have to be taken into account when selecting the semiconductor components. Thus, for example, the switch-off procedure of an electronic circuit breaker has to be slowed via suitable measures so as to reduce overvoltages and prevent damage to the semiconductor module.

SUMMARY OF THE INVENTION

The known problems can be avoided via the semiconductor module according to the present invention. It is advantageous that the heat generated by the semiconductor components can be dissipated effectively, and at the same time the parasitic inductivity of the semiconductor module can be significantly reduced. An insulated metal substrate is used as the carrier substrate of the semiconductor module, the insulating intermediate layer of the insulated metal substrate having at least one notch, and at least one terminal face of a semiconductor component provided on the upper side of the semiconductor component facing away from the carrier substrate being electrically connected to a contact element which is directly connected to the metal cooling body via the notch. Because the cooling body is used as an electrical conductor that is directly electrically connected to the terminal of a semiconductor component via the contact element, it is possible to significantly reduce the parasitic inductivity of the semiconductor module. In addition, it is easy to wire the printed conductors, as the metal cooling body also functions as a conductor for conveying the power required to operate the semiconductor component. Thanks to the very thin electrically insulating layer, and respectively, the very thin dielectric between the cooling body and the printed conductors on the upper side of the substrate, the parasitic inductivity is reduced further, and at the same time heat is dissipated into the cooling body very quickly and efficiently.

Advantageously, the contact element can be manufactured as a bonding wire which at one end is connected to the terminal of the semiconductor component and at the other end to the metal cooling body. Bonding wire technology is well understood and thanks to the direct connection between the bonding wire and the cooling body it is only necessary to create small notches in the insulating intermediate layer; these can be created inexpensively using a laser.

Advantageously, the metal cooling body is provided as a potential surface for making available the supply potential, in particular the ground potential, required to operate the semiconductor component.

To ensure that heat is dissipated as effectively as possible and that parasitic inductivity is reduced effectively, it is advantageous if the insulating layer is less than 250 µm thick.

Heat can be dissipated particularly efficiently if the metal cooling body is coupled with a cooling medium. It is particularly advantageous if the metal cooling body of the insulated metal substrate has cooling channels through which the cooling medium flows.

In direct voltage intermediate circuits having an intermediate circuit capacitor it is advantageous if the positive terminal of the capacitor is connected to a printed conductor of the metal layer on the upper side of the substrate and the negative terminal is connected directly to the metal cooling body. This allows the parasitic inductivity to be reduced further.

DETAILED DESCRIPTION

Figure 1:
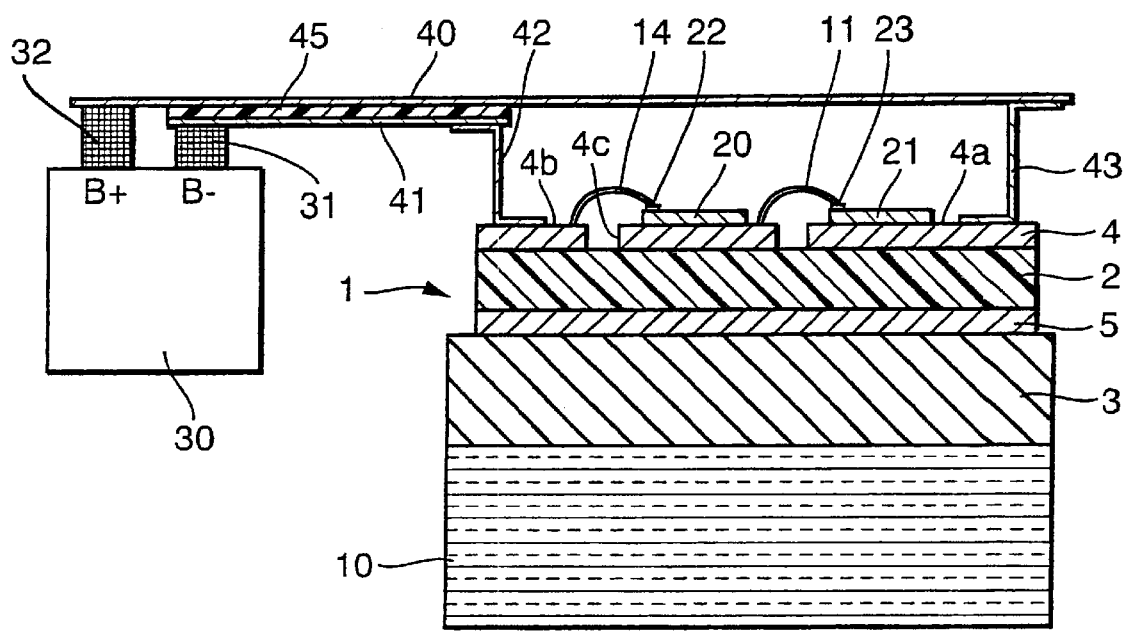
FIG. 1 shows a semiconductor module that is known from the related art.

FIG. 1 shows a semiconductor module that is known from the related art. A direct copper bonded substrate is used as carrier substrate 1 and includes an approximately 1-millimeter-thick ceramic layer 2, on the upper and lower sides of which approximately 300 μm-thick copper metal layers 4, 5 have been applied. It is also known that insulated metal substrates having a thin insulating layer provided with a metal layer on its upper side and a metal cooling body arranged directly on its lower side can be used. Printed conductors 4a, 4b, 4c are formed in upper metal layer 4 via structuring. Non-housed semiconductor components 20, 21, for example MOSFETs, power diodes, IGBTs or bipolar transistors, are provided on metal layer 4. Terminals (not shown) on the lower side of semiconductor components 20, 21 are electrically connected to printed conductors 4a, 4c, for example by soldering on non-housed semiconductor elements 20, 21. In addition, the semiconductor components are electrically connected to further printed conductors 4b, 4c via bonding wires 11, 14, which are connected to terminal faces 22, 23 on the upper side of the semiconductor components. A metal cooling body 3, which is made of, for example, copper, is soldered onto metal layer 5 on the lower side of carrier substrate 1. The lower side of cooling body 3 is in contact with a cooling medium 10, which is, for example, a cooling fluid. Further electrical components, such as a capacitor 30, are connected to printed conductors 4a, 4b via conductive connectors 40, 41 and metal jumpers 42, 43.

Figure 4:
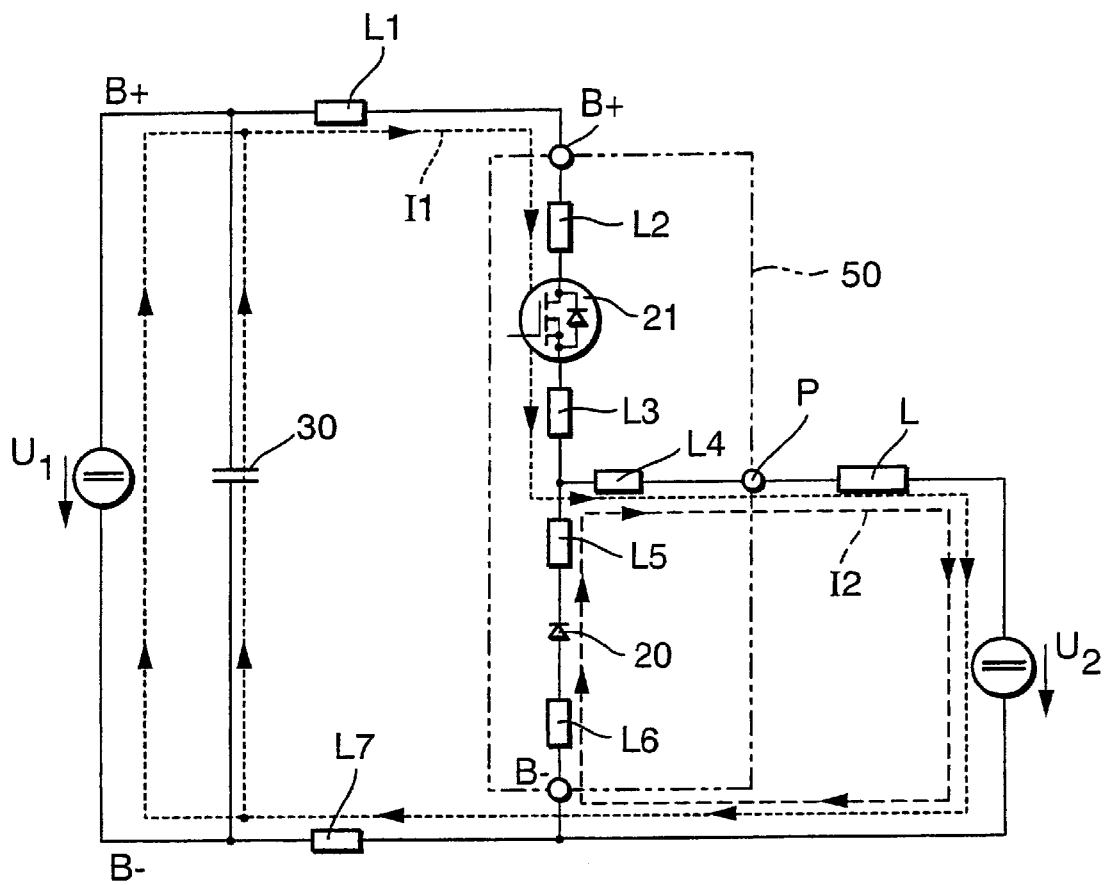
FIG. 4 shows a circuit diagram for the semiconductor module of a step-down converter shown in FIGS. 1, 2, and 3.

Below, the disadvantages of the known semiconductor module described above will be explained with reference to a step-down converter. However, these disadvantages exist with any power electronic circuits having a direct voltage circuit implemented with this semiconductor module, e.g., d.c. converters, rectifiers, inverters, isolating transformers and forward converters. A circuit diagram of the step-down converter is shown in FIG. 4, the electrical and electronic components of the semiconductor module being shown inside dot-dash line 50. Terminal B+ of the operating potential is connected to printed conductor 4a in FIG. 1; terminal B− is connected to printed conductor 4b. Phase terminal P is connected to printed conductor 4c. In this example, semiconductor component 21 is a circuit breaker, e.g., a MOSFET, and component 20 is a semiconductor diode. If circuit breaker 21 is switched off, the current commutates from MOSFET 21 to diode 20. The following is true of electrical voltage $U_{MOSFET}$ that drops at the MOSFET when switching off:

$$U_{MOSFET}=U_1(L_1+L_2+L_4+L_5+L_6+L_7) \cdot dI_1/dt \text{ and } dI_1/dt<0,$$

$U_1$ being the intermediate circuit voltage applied to the semiconductor module between printed conductors 4a and 4b and $L_1$ to $L_7$ being the parasitic inductivities that arise. According to the equation above, the voltage drops in parasitic inductivities $L_1$ to $L_7$ that occur when switching-off at the MOSFET cause an overvoltage that is greater than intermediate circuit voltage $U_1$. Therefore the switching-off procedure has to be slowed with the help of additional measures so that the maximum blocking voltage of the MOSFET is not exceeded. The greater the parasitic inductivities $L_1$ to $L_7$, the greater the undesirable overvoltage. The parasitic inductivities shown in FIG. 4 can be assigned directly to the structure of the semiconductor module in FIG. 1. In FIG. 1, parasitic inductivity $L_1$ is caused by electrical terminal connector 40 of positive pole 32 of intermediate circuit capacitor 30. Parasitic inductivity $L_2$ is caused by terminal link 43 and printed conductor 4a. Parasitic inductivities $L_3$ and $L_5$ are caused by the electrical conductive connector from MOSFET 21 to semiconductor diode 20, i.e., by bonding wire 11 and printed conductor 4c. Parasitic inductivity $L_6$ is caused by printed conductor 4b and terminal link 42; parasitic inductivity $L_7$ is caused by terminal connector 41 of intermediate circuit capacitor 30. Parasitic inductivity $L_4$ relating to the connection from the contact designated P to printed conductor 4c is not shown in FIG. 1. Inductivities $L_2$ and $L_7$ can be slightly reduced thanks to the fact that terminal connectors 40 and 41 are arranged close to one another in intermediate circuit bar 45; however, as FIG. 1 indicates, there is a large area between the B+ terminal and the B− terminal of the semiconductor module, i.e., between terminal links 43 and 42, which means parasitic inductivities $L_2$ and $L_6$ are substantial and cannot be significantly reduced by optimizing the structure. In addition, the connection between printed conductor 4c and semiconductor component 20 is more problematic, because potential terminals B+ and B− are arranged in upper metal layer 4, which means parasitic inductivities $L_3$ and $L_5$ are substantial. In the case of the semiconductor modules known from the related art, parasitic inductivities $L_1$ to $L_7$ cannot be reduced further, which results in the disadvantages described above.

Figure 2:
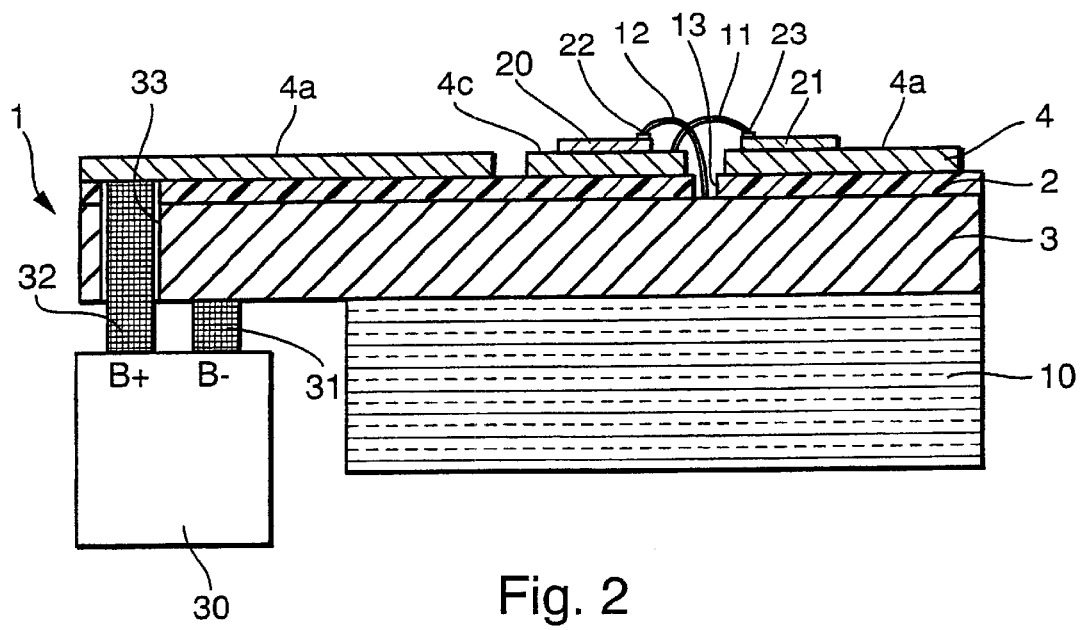
FIG. 2 shows a first exemplary embodiment of a semiconductor module according to the present invention.

FIG. 2 shows a first exemplary embodiment of the semiconductor module according to the present invention. Once again, in this example the advantages will be explained with reference to a step-down converter. However, the advantages apply in the case of any bonding or isolating power electronic circuits having a direct voltage circuit. As shown in FIG. 2, an insulated metal substrate which is known per se and which includes a metal cooling body 3, which is a plurality of millimeters thick and is made of, for example, aluminum, and on the upper side of which an electrically insulating layer 2 is applied, is used as carrier substrate 1 for the semiconductor module. In this example, the electrically insulating layer is 140 μm thick and should not be thicker than 250 μm thick. The insulating layer is preferably made of a polymer into which ceramic particles that conduct heat effectively have been introduced. An approximately 300-μm-thick metal layer 4 in which printed conductors 4a, 4c are formed via structuring in a known manner and which is made of, for example, copper is applied to insulating layer 2. The lower side of metal cooling body 3 is in heat contact with a cooling medium 10. Non-housed semiconductor components 20, 21 are arranged on metal layer 4. However, it is also possible to arrange other electrical and/or electronic components, for example housed semiconductor components, on the semiconductor module. In the case of the exemplary embodiment shown here, semiconductor component 21 is a MOSFET and semiconductor component 20 is a semiconductor diode. In a different circuit arrangement, an IGBT, bipolar transistor or other semiconductor component can be used instead of the MOSFET. A switchable power semiconductor, for example a bipolar transistor, MOSFET or IGBT, can be used instead of the semiconductor diode. The lower side of MOSFET 21 is in electrical contact with printed conductor 4a. Two terminal faces 23 are arranged on the upper side of MOSFET 21 facing away from carrier substrate 1; in FIG. 2, just one is shown. Terminal face 23 is connected to a bonding wire 11 whose end is connected to printed conductor 4c. On the lower side of semiconductor diode 20 there is a first terminal face which is electrically connected to printed conductor 4c. A second terminal face 22 of semiconductor diode 20 is arranged on the side of the semiconductor diode facing away from carrier substrate 1 and is connected to a contact element embodied as bonding wire 12. Bonding wire 12 is electrically connected directly to cooling body 3 via the gap between printed conductors 4c and 4a. and via a notch 13 in insulating layer 2. Herein, a direct connection means a connection without intermediate connections involving other components. Notch 13 has a diameter of, for example, 3 millimeters and can be created in insulating 2 easily using a laser. In contrast with a direct copper bonded substrate, the stability of carrier substrate 1 is guaranteed thanks to metal plate 3 and thus is not diminished by notch 13 in insulating layer 2. In FIG. 2, positive pole 32 of an intermediate circuit a capacitor 30 is connected to printed conductor 4a on the upper side of carrier substrate 1 via a recess 33 provided in cooling body 3 and insulating layer 2, for example via screwing or riveting. Negative pole 31 of intermediate circuit capacitor 30 is connected to cooling body 3. In the case of the step-down converter shown in FIG. 2, the circuit diagram for which is shown in FIG. 4, supply potential B+ is connected to printed conductor 4a and ground potential B− is connected to cooling body 3. Particularly in semiconductor modules used in motor vehicles, one terminal of the power semiconductor components is often connected to ground potential so that cooling body 3 can be connected to the B− potential directly without an insulating intermediate layer. By using cooling body 3 as a conductor for conveying ground potential B−, the area between potentials B+ and B− can be significantly reduced compared to that in the known semiconductor modules shown in FIG. 1 and thus parasitic inductivities $L_2$ and $L_6$ can be reduced substantially. Upper metal layer 4 largely conveys just potential B+. Only the area for printed conductor 4c and the gap between the printed conductors have to be created. Furthermore, thanks to the very thin insulating layer 2, parasitic inductivities $L_1$ and $L_7$ can be reduced much more significantly than with the intermediate circuit bar of the semiconductor module shown in FIG. 1. Furthermore, in the case of the semiconductor module according to the present invention it is advantageous that the heat generated by semiconductor components 20, 21 passes very quickly through insulating layer 2, which is thin and conducts heat effectively, to cooling body 3 and from there is transferred into cooling medium 10.

If further electrical and/or electronic components that are to be connected to the B− potential are provided, additional notches are created at additional points in insulating layer 2 and in each case a bonding wire passes through each respective notch and thus connects the respective components to the cooling body. Thus it is advantageous that cooling body 3 can form the joint ground terminal for all the components. This makes it much easier to create the printed conductor paths on the upper side of the substrate.

Figure 3:
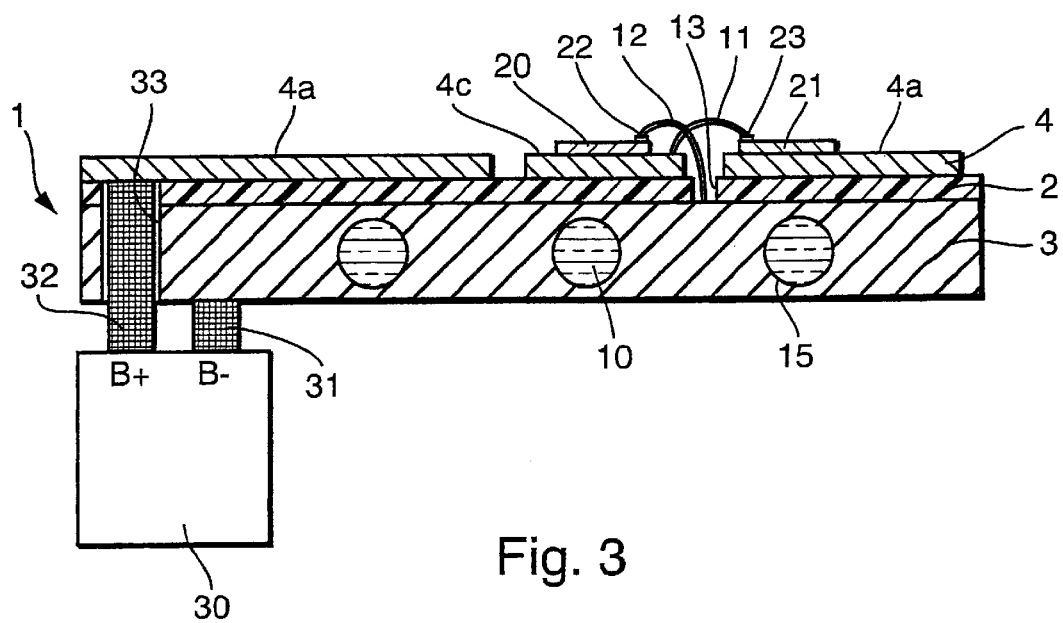
FIG. 3 shows a second exemplary embodiment of a semiconductor module according to the present invention.

FIG. 3 shows a further exemplary embodiment of the semiconductor module according to the present invention. Elements that are the same have been assigned the same reference numbers. In contrast with the exemplary embodiment shown in FIG. 2, in FIG. 3 cooling body 3 has meandering cooling channels 15 through which cooling medium 10 flows. As a result, the heat is dissipated even more effectively.

The use of the semiconductor module according to the present invention is not by any means limited to the application described above, namely a step-down converter; indeed the semiconductor module can also be used to reduce parasitic inductivity and improve heat dissipation in other power electronic circuit topologies having a direct voltage circuit.

What is claimed is:

1. An electronic semiconductor module, comprising:

a carrier substrate including:
an electrically insulating layer including at least one notch,
a metal layer arranged on an upper side of the electrically insulating layer and in which printed conductors are formed via structuring, and
a metal cooling body arranged on a lower side of the electrically insulating layer,
at least one semiconductor component arranged on the carrier substrate;
a contact element directly connected to the metal cooling body via the at least one notch; and
at least one terminal face provided on an upper side of the at least one semiconductor component and facing away from the carrier substrate, the at least one terminal face being electrically connected to the contact element.

2. The electronic semiconductor module according to claim 1, wherein:
the contact element includes a bonding wire connected to the at least one terminal face and to the metal cooling body.

3. The electronic semiconductor module according to claim 1, wherein:
the metal cooling body acts as a potential surface for making available a supply potential required to operate a semiconductor compound.

4. The electronic semiconductor module according to claim 3, wherein:
the supply potential corresponds to a ground potential.

5. The electronic semiconductor module according to claim 1, wherein:
a thickness of the electrically insulating layer is less than 250 $\mu$m thick.

6. The electronic semiconductor module according to claim 1, further comprising:
a cooling medium to which is coupled the metal cooling body.

7. The electronic semiconductor module according to claim 6, wherein:
the metal cooling body includes cooling channels through which the cooling medium flows.

8. The electronic semiconductor module according to claim 1, further comprising:
a capacitor including a positive terminal connected to a printed conductor of the metal layer and a negative terminal connected to the metal cooling body.

* * * * *